(12) United States Patent
Pei

(10) Patent No.: US 8,251,013 B2
(45) Date of Patent: Aug. 28, 2012

(54) VAPOR DEPOSITION DEVICE

(75) Inventor: Shao-Kai Pei, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 384 days.

(21) Appl. No.: 12/718,097

(22) Filed: Mar. 5, 2010

(65) Prior Publication Data

US 2011/0126763 A1 Jun. 2, 2011

(51) Int. Cl.
*C23C 16/452* (2006.01)

(52) U.S. Cl. .................... 118/723 FI; 118/726

(58) Field of Classification Search .................. 118/726, 118/723 FI

See application file for complete search history.

(56) References Cited

U.S. PATENT DOCUMENTS

2011/0126763 A1* 6/2011 Pei .......................... 118/723 FI

* cited by examiner

*Primary Examiner* — Sylvia R. MaArthur
(74) *Attorney, Agent, or Firm* — Altis Law Group, Inc.

(57) ABSTRACT

A vapor deposition device includes a holding compartment and a reaction device. The holding compartment defines a receiving chamber and includes a number of inner side surfaces and a number of holding plates disposed on the respective inner side surfaces, each holding plate defines a number of holding grooves for holding substrates. The reaction device is rotatably received in the receiving chamber and includes an outer barrel and an inner barrel received in the outer barrel, the outer barrel and the inner barrel cooperatively defines a first room, the inner barrel defines a second room; the reaction device includes ion nozzles communicating with the second room and precursor gas nozzles communicating with the first room; the outer barrel includes at least one crucible and at least one electron beam gun received in the first room, the inner barrel includes an ion source received in the second room.

9 Claims, 3 Drawing Sheets

VAPOR DEPOSITION DEVICE

BACKGROUND

1. Technical Field

The present disclosure relates to coating technology and, particularly, to a vapor deposition device.

2. Description of Related Art

Current deposition devices typically include a crucible and an ion source, and the crucible and the ion source is fixedly disposed in the deposition devices. Therefore, some of precursor gases vaporized from the crucible fail to achieve position match with ions emitted from the ion source. Consequently, reduction of the purity of the coating is likely as some of the precursor gas may not be fully oxidized by the ions and directly deposited on a substrate.

Therefore, it is desirable to provide a vapor deposition device, which can overcome the above-mentioned limitations.

DETAILED DESCRIPTION

Embodiments of the disclosure are now described in detail with reference to the drawings.

Figure 1:
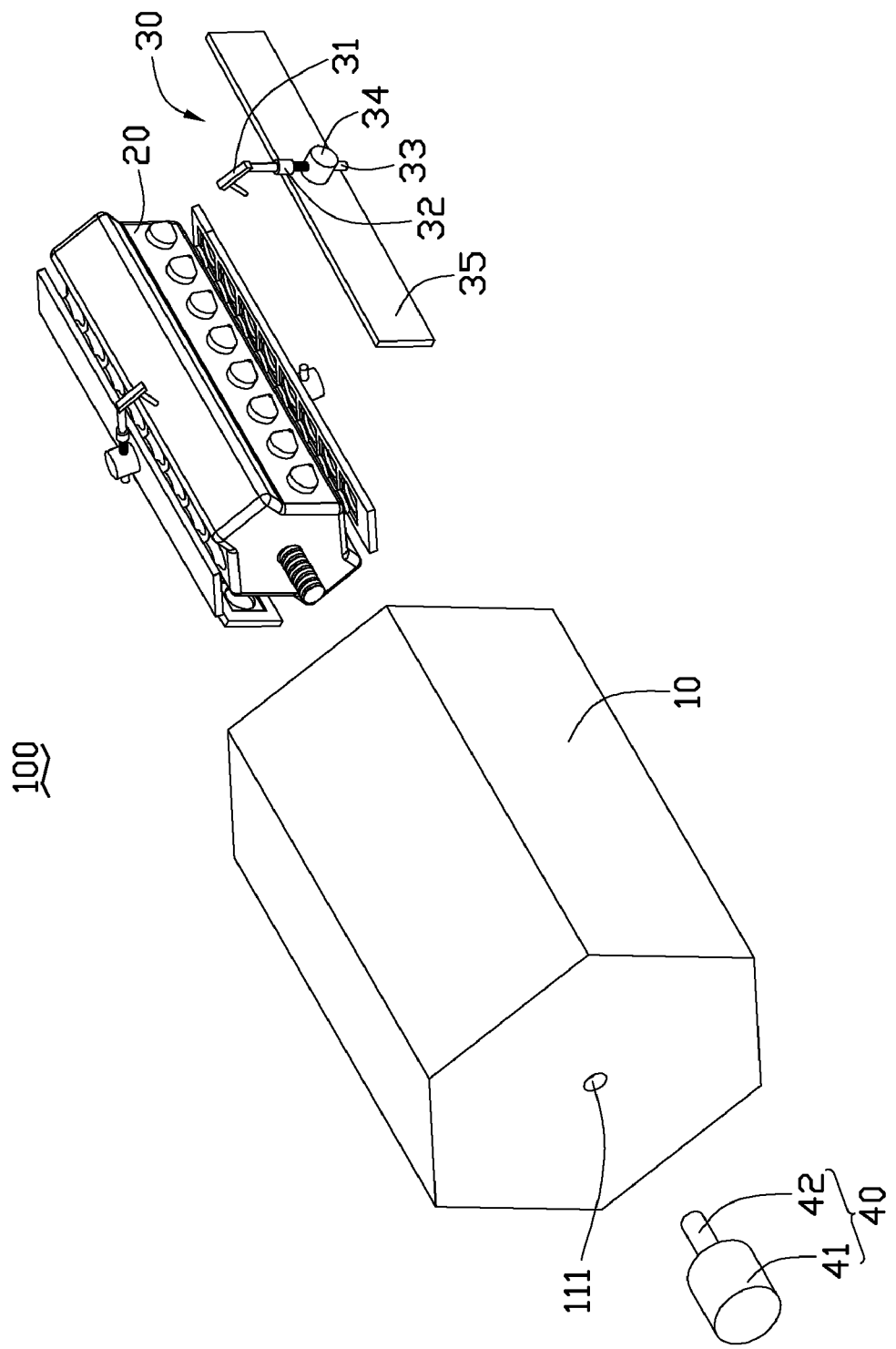
FIG. 1 is an isometric and exploded view of a vapor deposition device, according to an exemplary embodiment.
Figure 2:
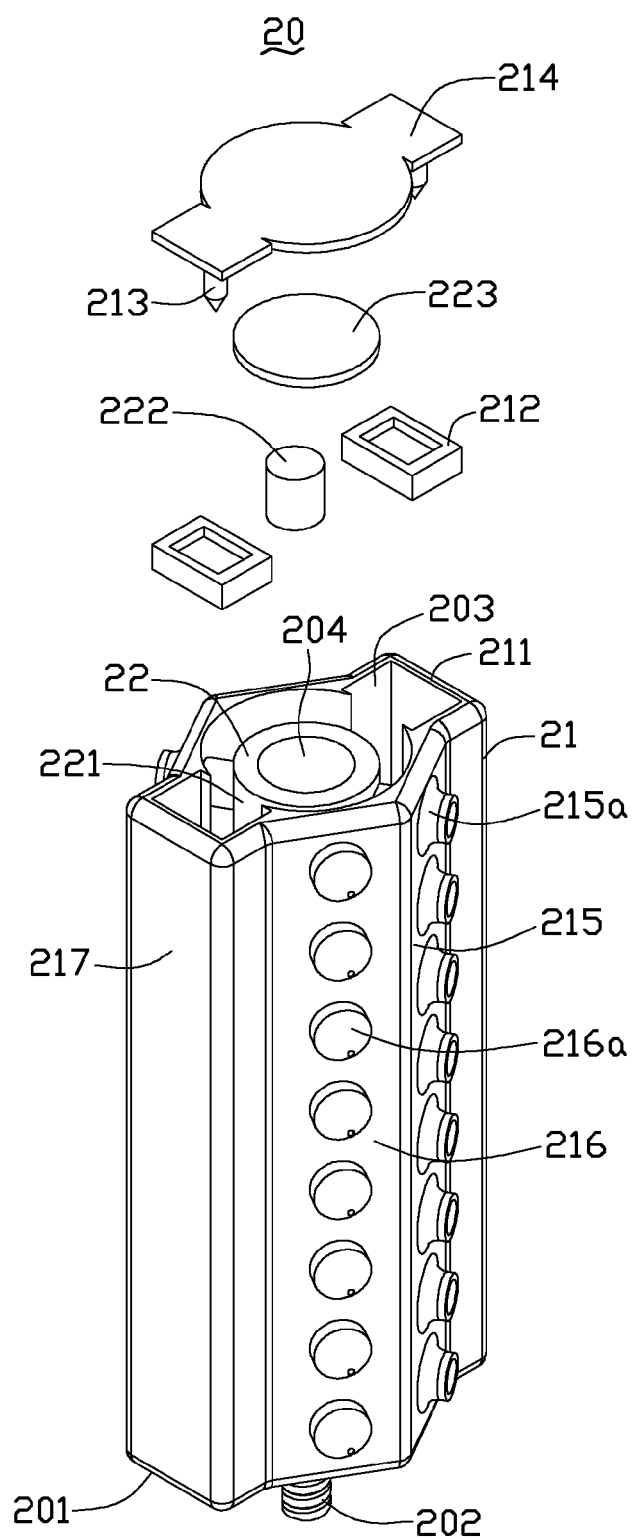
FIG. 2 is an isometric and exploded view of a reaction device of the vapor deposition device of FIG. 1.
Figure 3:
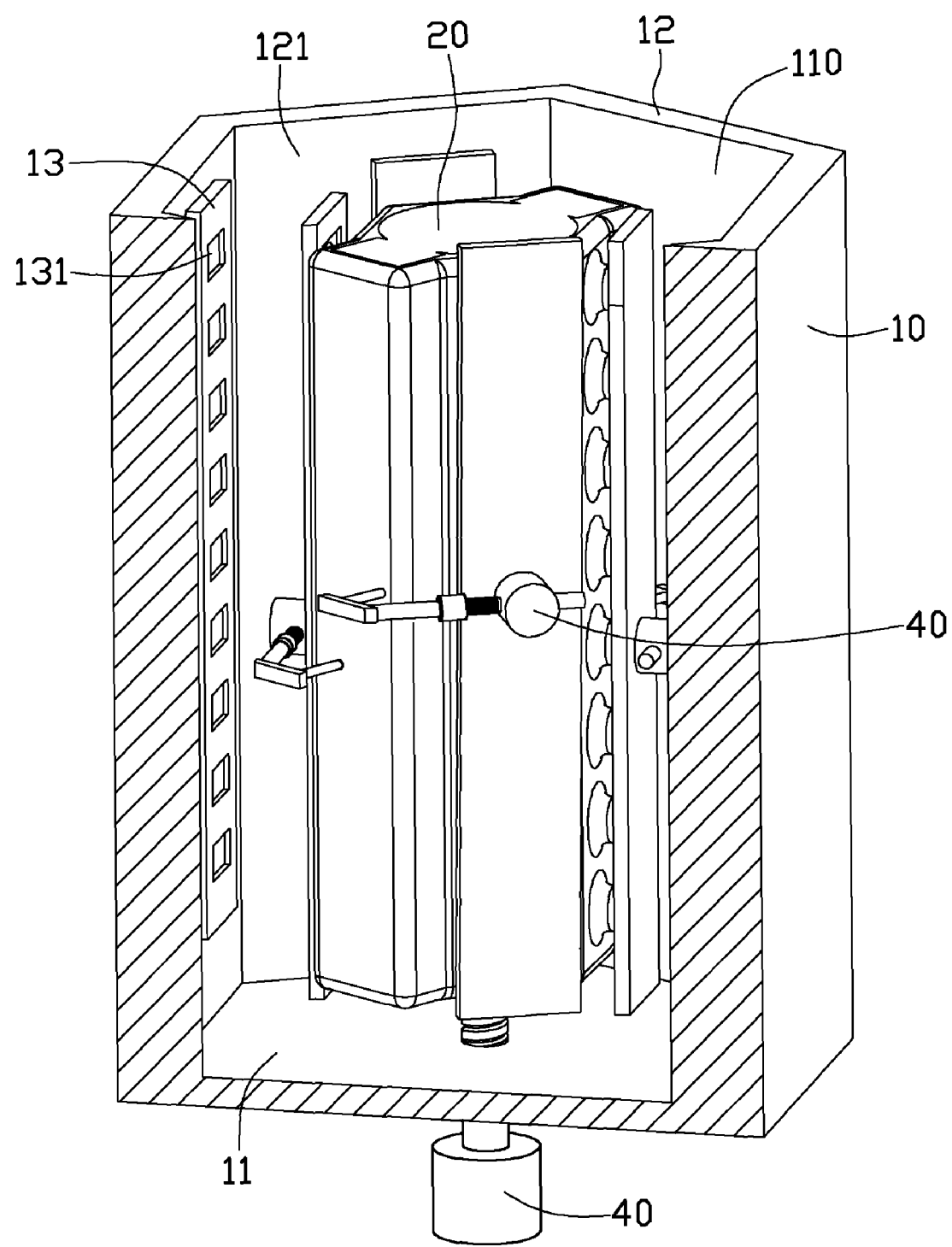
FIG. 3 is a cut-away view of the vapor deposition device of FIG. 1.

Referring to the FIGS. 1-3, a vapor deposition device 100, according to an exemplary embodiment, is configured for coating for a number of substrates (not shown). The deposition device 100 includes a holding compartment 10, a reaction device 20, a number of shielding devices 30, and a first actuator 40.

The holding compartment 10 is generally a hexagonal prism chamber, and includes a bottom plate 11, a sidewall 12, and a number of holding plates 13. The bottom plate 11 defines a shaft hole 111 at the center thereof. The sidewall 12 perpendicularly extends from the edge of the bottom plate 11, and forms, cooperating with the bottom plate 11, a receiving chamber 110. The receiving chamber 110 is bounded by six inner side surfaces 121 of the sidewall 12. The holding plates 13 are disposed on the inner side surfaces 121, respectively, and are arranged along the longitude direction of the holding compartment 10. Each holding plate 13 defines a number of holding grooves 131, which face the interior of the holding compartment 10. Each of the holding grooves 131 is shaped corresponding to the substrates and is configured for holding substrates.

It should be noteworthy that the holding compartment 10 is not limited to this embodiment. To reduce or increase the number of the inner side surfaces 121 for holding less or more substrates, other shapes of holding compartment 10 having less or more inner side surfaces 121 can be employed.

The reaction device 20 includes a lower plate 201, and a shaft 202 perpendicularly extending perpendicularly through the center of the lower plate 201. The reaction device 20 receives in the receiving chamber 110 of the holding compartment 10, and the shaft 202 rotatably extending through the shaft hole 111.

The reaction device 20 further includes an outer barrel 21 and an inner barrel 22. The outer barrel 21 and the inner barrel 22 are disposed on the lower plate 201 and the inner barrel 22 is received in the outer barrel 21. The outer barrel 21 and the inner barrel 22 cooperatively define a first room 203 therebetween. The inner barrel 22 defines a second room 204 therein.

The outer barrel 21 is generally a hexagonal prism chamber, and includes a first main body 211, two crucibles 212, two electron beam guns 213, and a first upper cover 214. The first main body 211 is perpendicularly disposed on the lower plate 201, and includes two opposite first side surfaces 215, two opposite second side surfaces 216, and two opposite third side surfaces 217. The reaction device 20 protrudes outwardly with a number of ion nozzles 215a protruding from the first side surfaces 215 and with a number of precursor gas nozzles 216a protruding from the second side surface 216. The ion nozzles 215a communicate with the second room 204, and the precursor gas nozzles 216a communicate with the first room 203. The two crucibles 212 are received in the first room 203 and adjacent to the lower plate 201. The electron beam guns 213 are mounted on the first upper cover 214. The first upper cover 214 seals the other end of the first main body 211 opposite to the lower plate 201, and the electron beam guns 213 are align with and face the crucibles 212. The first upper cover 214 seals the first room 203.

The inner barrel 22 is a hollow cylinder, and includes a second main body 221, an ion source 222, and a second upper cover 223. The second main body 221 is perpendicularly disposed on the lower plate 201. The ion source 222 is received in the second room 204, and disposed on the lower plate 201. The ion source 222 is configured for emitting ions. The second upper cover 223 seals another end of the second main body 221 opposite to the lower plate 201. The second upper cover 223 seals the second room 204.

Each of the shielding devices 30 includes a connection rod 31, a second actuator 32, a lead screw 33, a screw cap 34, and a shielding plate 35. The connection rod 31 extends from the third side surface 217 and is bent towards a neighboring first side surface 215 or second side surface 216. The second actuator 32 is fixed to the connection rod 31. The lead screw 33 is coupled to the second actuator 32, and the second actuator 32 configured to drive the lead screw 33 to rotate. The screw cap 34 is disposed on the shielding plate 35, and the lead screw 33 is threadedly engaged the screw cap 34. In this embodiment, each of the third side surfaces 217 has two shield devices 30 mounted thereon, with one shielding plate 35 thereof parallel to the first side surfaces 215 and the other shielding plate 35 thereof parallel to the second side surfaces 216.

It is noteworthy that the shielding device 30 is not limited to this embodiment. To close or open the ion nozzles 215a and precursor gas nozzles 216a, other structure of the shielding devices 30 can be employed.

The first actuator 40 includes a stator 41 and a rotor 42. The rotor 42 is coupled to the shaft 202, and the first actuator 40 drives the reaction device 20 to rotate.

In the initial operation, the second actuators 32 drive the shielding plates 35 to seal the ion nozzles 215a of the first side surfaces 215 and the precursor gas nozzles 216a of the second side surfaces 216. Electrons emitted from the electron beam guns 213 heat the precursors received in the crucibles 212 to vaporize the precursors into corresponding precursor gases. The precursor gases fill the first room 203. The ion source 40 emits oxidizing ions. The oxidizing ions fill the second room 204.

When the gas pressure of the precursor gases and the oxidizing ions exceeds a preset pressure, the second actuators 32 drive the shielding plates 35 to open the ion nozzles 215a and the precursor gas nozzles 216a. At same time, the first actuator 40 drives the reaction device 20 to rotate. The precursor gases release from the precursor gas nozzles 216a and the oxidizing ions release from the ion nozzles 215a and intermix with each other. Therefore, the precursor gases can be fully oxidized by the oxidizing ions before the precursor gases coat on the substrates.

It will be understood that the above particular embodiments and methods are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. A vapor deposition device, comprising:
    a holding compartment defining a receiving chamber and comprising a plurality of inner side surfaces and a plurality of holding plates disposed on the respective inner side surfaces, each holding plate defining a plurality of holding grooves for holding substrates;
    a reaction device rotatably received in the receiving chamber and comprising an outer barrel and an inner barrel received in the outer barrel, the outer barrel and the inner barrel cooperatively defining a first room therebetween, the inner barrel defining a second room therein; the reaction device comprising a plurality of ion nozzles communicating with the second room and a plurality of precursor gas nozzles communicating with the first room; the outer barrel comprising at least one crucible and at least one electron beam gun received in the first room, the inner barrel comprising an ion source received in the second room.

2. The vapor deposition device in claim 1, wherein the holding compartment comprises a bottom plate, and the bottom plate defines a shaft hole at the center thereof; and the reaction device comprises a lower plate, and a shaft extending perpendicularly through the center of the lower plate, the shaft rotatably extending through the shaft hole.

3. The vapor deposition device in claim 2, further comprising a first actuator, wherein the first actuator comprises a stator and a rotor, and the rotor is coupled to the shaft.

4. The vapor deposition device in claim 2, wherein the outer barrel further comprises a first main body and a first upper cover; the first main body is disposed on the lower plate, the crucible is received in the first room and adjacent to the lower plate, the at least one electron beam gun is mounted on the first upper cover, the first upper cover seals the first room, and the at least one electron beam gun is align with and faces the crucible.

5. The vapor deposition device in claim 4, wherein the inner barrel further comprises a second main body and a second upper cover; the second main body is disposed on the lower plate, the ion source is received in the second room and adjacent to the lower plate, the second upper cover seals the second room.

6. The vapor deposition device in claim 5, wherein the outer barrel comprises two opposite first side surfaces, two opposite second side surfaces, and two opposite third side surfaces; the ion nozzles protrude outwardly from the first side surfaces, the precursor gas nozzles protrude outwardly from the second side surfaces.

7. The vapor deposition device in claim 6, further comprises a plurality of shielding devices, wherein the shielding devices are disposed on the third side surfaces, and configured for closing or opening the ion nozzles on the first side surfaces and the precursor gas nozzles on the second side surfaces.

8. The vapor deposition device in claim 7, wherein each of the shielding devices comprises a connection rod, a second actuator, a lead screw, a screw cap, and a shielding plate; the connection rod extends from the third side surface and is bent towards a neighboring first side surface or second side surface, the second actuator is fixed to the connection rod, the lead screw is coupled to the second actuator, and the second actuator configured to drive the lead screw to rotate, the screw cap is disposed on the shielding plate, and the lead screw is threadedly engaged with the screw cap.

9. The vapor deposition device in claim 8, wherein each of the third side surfaces has two shielding devices mounted thereon, with one shielding plate thereof parallel to the first side surfaces and the other shielding plate thereof parallel to the second side surfaces.

* * * * *

UNITED STATES PATENT AND TRADEMARK OFFICE
CERTIFICATE OF CORRECTION

PATENT NO. : 8,251,013 B2
APPLICATION NO. : 12/718097
DATED : August 28, 2012
INVENTOR(S) : Pei Page 1 of 1

It is certified that error appears in the above-identified patent and that said Letters Patent is hereby corrected as shown below:

Title Page, below Item (65) insert

-- [30]   Foreign Application Priority Data

Nov. 30, 2009   (CN) .........................200910310613.4 --

Signed and Sealed this
Twenty-ninth Day of October, 2013

Teresa Stanek Rea
*Deputy Director of the United States Patent and Trademark Office*